US005568492A

United States Patent [19]
Flint et al.

[11] Patent Number: 5,568,492
[45] Date of Patent: Oct. 22, 1996

[54] CIRCUIT AND METHOD OF JTAG TESTING MULTICHIP MODULES

[75] Inventors: Andrew Flint, Chandler; James R. Trent, Mesa; Jerome A. Grula, Chandler, all of Ariz.

[73] Assignee: Motorola, Inc., Schaumburg, Ill.

[21] Appl. No.: 254,846

[22] Filed: Jun. 6, 1994

[51] Int. Cl.⁶ .................................................. H04B 17/00
[52] U.S. Cl. ........................ 371/22.1; 371/22.3; 371/22.5
[58] Field of Search ................................. 371/22.1, 22.3, 371/22.4, 22.5, 24, 27; 307/272.2

[56] References Cited

U.S. PATENT DOCUMENTS

| | | | |
|---|---|---|---|
| 5,230,000 | 7/1993 | Mozingo et al. | 371/22.4 |
| 5,281,864 | 7/1994 | Hahn et al. | 307/272.2 |
| 5,319,646 | 7/1994 | Simpson et al. | 371/22.3 |

Primary Examiner—Hoa T. Nguyen
Attorney, Agent, or Firm—Robert D. Atkins

[57] ABSTRACT

A multichip module (10) having one or more IC die (12–18) supports JTAG testing with a plurality of registers (20–26) within each IC die. JTAG testing requires a one cycle delay bypass mode where registers within an IC not under test are bypassed. To support bypass mode when JTAG testing the multichip module on a printed circuit board, a bypass circuit around the multichip module provides the one cycle delay. The bypass circuit monitors the test data signals to the multichip module and enters bypass mode upon detecting a predetermined sequence of logic states during the instruction sequence. Otherwise, the test data signal passes through a plurality of registers within each IC die. The detection may be performed by counting logic states or otherwise monitoring in the instruction sequence.

19 Claims, 5 Drawing Sheets

CIRCUIT AND METHOD OF JTAG TESTING MULTICHIP MODULES

BACKGROUND OF THE INVENTION

The present invention relates in general to integrated circuit testing and, more particularly, to Joint Test Action Group (JTAG) testing of multichip modules.

Integrated circuits (IC) generally require extensive testing to ensure proper operation and functionality. To aid in the testing of ICs, JTAG procedures have developed into IEEE standard 1149.1. One of the features of JTAG testing allows for testing of interconnects between IC chips. To test interchip interconnects, JTAG uses a boundary scan technique where a continuous string of serially coupled registers are added to each IC with the output register of one IC chip coupled to the input register of the next IC chip. Each register is commonly referred to as a boundary scan cell and there is generally one boundary scan cell per each I/O pin of the IC chip.

To perform an interchip interconnect test, a test signal is applied to the first cell of the first IC chip, i.e. TEST DATA IN, and shifted along the boundary scan cells to the cell associated with the I/O pin that is to be tested for connectivity. Assuming the interconnect is intact, the test signal should propagate to another I/O pin as determined by, the particular interchip interconnect. The test signal is then captured in the JTAG cell associated with the second I/O pin and shifts along the remaining boundary scan cells to the last register of the last IC chip. If the interchip interconnect is intact then the test signal Should appear at the final JTAG output cell, i.e. TEST DATA OUT. The IEEE 1149.1 standard also has provisions for testing functionality of the IC.

A unique problem occurs for applications involving multichip modules (MCM). An MCM includes a plurality of IC die disposed on a single substrate. The MCM substrate package having multiple IC die is later integrated by end users into larger systems or circuit boards containing other IC chips, or possibly other MCMs. Thus, for testing purposes the manufacturer treats the MCM as a collection of ICs. However, the end user treats the MCM as a single IC for testing purposes even though it contains multiple IC die on its own.

One of the requirements of JTAG testing under the IEEE 1149.1 standard is to support bypass mode where an IC chip can be disabled from shifting the test pattern. Bypass mode is typically used to speed up the testing process by side stepping an IC if its particular connectivity is not under test. Consequently, there is no reason to shift the test signal through the IC if its connectivity is not under test. The IEEE standard calls for a single-register (one clock cycle) delay through the IC chip when operating in JTAG bypass mode.

The problem arises for MCMs in that the end user treats the MCM as a single IC chip although in reality it contains multiple IC die on a single substrate. Each IC die on the MCM has a single-register delay because of the need to be JTAG compatible. The multiple IC die on the MCM, each with its own single-register delay, violates the one clock cycle delay standard for the MCM as a whole when in the end user's hands. For example, assume the MCM includes six JTAG compatible IC die each with a single-register delay to comply with the IEEE standard. When the end user puts the MCM in bypass mode the test signal would undergo six register delays through the six IC die of the MCM, thereby violating the one clock cycle delay IEEE standard for the MCM as a whole.

Most if not all MCMs fail to support JTAG testing for the end user who wishes to treat the MCM as a single IC chip in the larger system. Hence, a need exists to support JTAG testing on MCMs for the end user.

DETAILED DESCRIPTION OF THE PREFERRED EMBODIMENT

Figure 1:
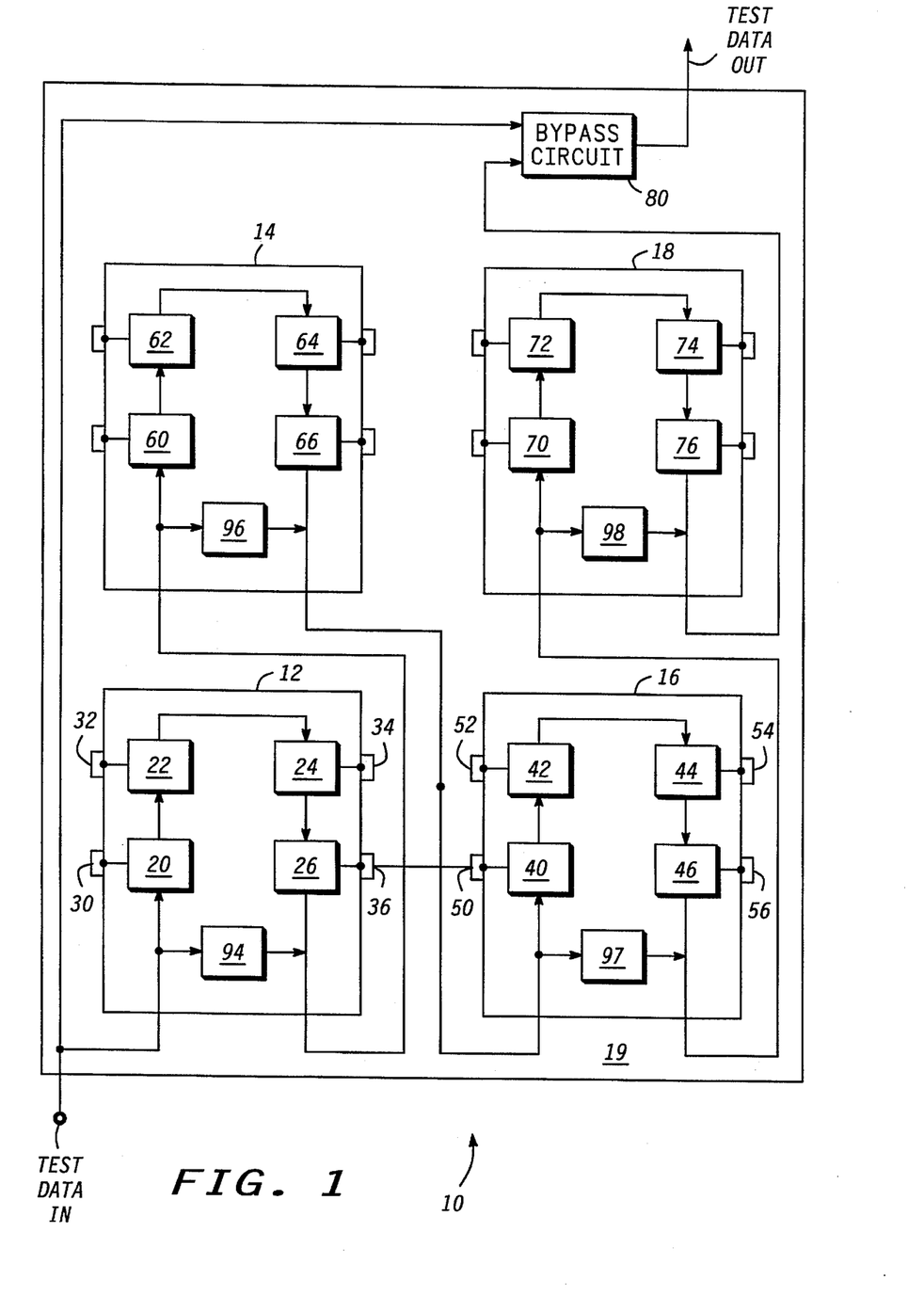
FIG. 1 is a simplified block diagram illustrating a multichip module with JTAG testing circuits.

Referring to FIG. 1, a multichip module (MCM) 10 includes four IC die 12, 14, 16 and 18 disposed on substrate 19 for performing various functional tasks according to the application. MCM 10 could include any combination of ICs on any substrate, e.g. printed circuit board containing package ICs.

To support JTAG testing under IEEE standard 1149.1, IC die 12 further includes four serially coupled boundary scan cells 20, 22, 24, and 26. There is one boundary scan cell per I/O pin. Cells 20 and 22 have outputs coupled to I/O pins 30 and 32, respectively. Cells 24 and 26 have outputs coupled to I/O pins 34 and 36, respectively. Similarly, IC die 16 includes serially coupled boundary scan cells 40, 42, 44, and 46 coupled to I/O pins 50, 52, 54 and 56, respectively. IC die 14 includes serially coupled boundary scan cells 60, 62, 64 and 66, while IC die 18 includes serially coupled boundary scan cells 70, 72, 74 and 76.

The JTAG cells are used to test functional interconnections between ICs 12, 14, 16 and 18 in MCM 10. The JTAG cells receive serial bit instructions by way of TEST DATA IN that are stored in instruction registers (not shown) within each IC. The instruction register works in conjunction with a state machine (also not shown) within each IC to generate standard JTAG control signals as described hereinafter. The implementation and operation of the JTAG state machine and control signals is well known in the art and under the IEEE standard 1149.1. The instructions and state machine set the JTAG cells in the proper mode of operation to shift and capture subsequent TEST DATA signals that actually verify proper interconnects between the ICs.

To perform an interchip interconnect test between ICs 12 and 16, an IEEE standard EXTEST instruction is shifted into ICs 12 and 16. A logic one TEST DATA IN signal from test equipment (not shown) is applied to cell 20 of IC 12 and shifted along the boundary scan cells in response to a standard IEEE TCK (test clock) control signal to the cell coupled to the I/O pin that is to be tested for connectivity. TCK is the main clock signal for the JTAG test circuitry. For example, to test the interchip interconnect between I/O pin 36 of IC 12 and I/O pin 50 of IC 14, a logic one TEST DATA signal shifts through cells 20, 22, 24 and into cell 26 during four TCK clock signals.

The capture mode is initiated by the state machine when data shifting is complete. The TEST DATA signal from pin 36 propagates over the interconnect to pin 50 for capture in cell 40 of IC 16. Following the capture of TEST DATA into register 40, capture mode is suspended and shift mode re-initiated by the state machine. The logic level in cell 40 shifts into register 42. Shift mode continues until the TEST DATA signal is present at cell 46. The next shift causes the TEST DATA to go to cell 70 in IC 18. Subsequent TCK clocks shift the TEST DATA signal through IC 18 and bypass circuit 80 to TEST DATA OUT of MCM 10.

The test equipment measures the logic level to verify that the same logic one has indeed propagated over the interconnect under test. If the interchip interconnect between I/O pins 36 and 50 is intact, the logic one TEST DATA signal should appear at the output of JTAG output cell 76 following the shifting sequence. The shift, capture, and shift process is repeated for a logic zero TEST DATA IN signal.

If an open between I/O pin 36 and I/O pin 50 exists, the fault will cause at least one of the logic zero/logic one tests to fail. That is, when a logic one test signal is sent the fault causes a logic zero to be stored in cell 40, or when a logic zero test signal is sent the fault causes a logic one to be stored. If one of the tests fails, the interconnect is declared faulty.

Figure 2:
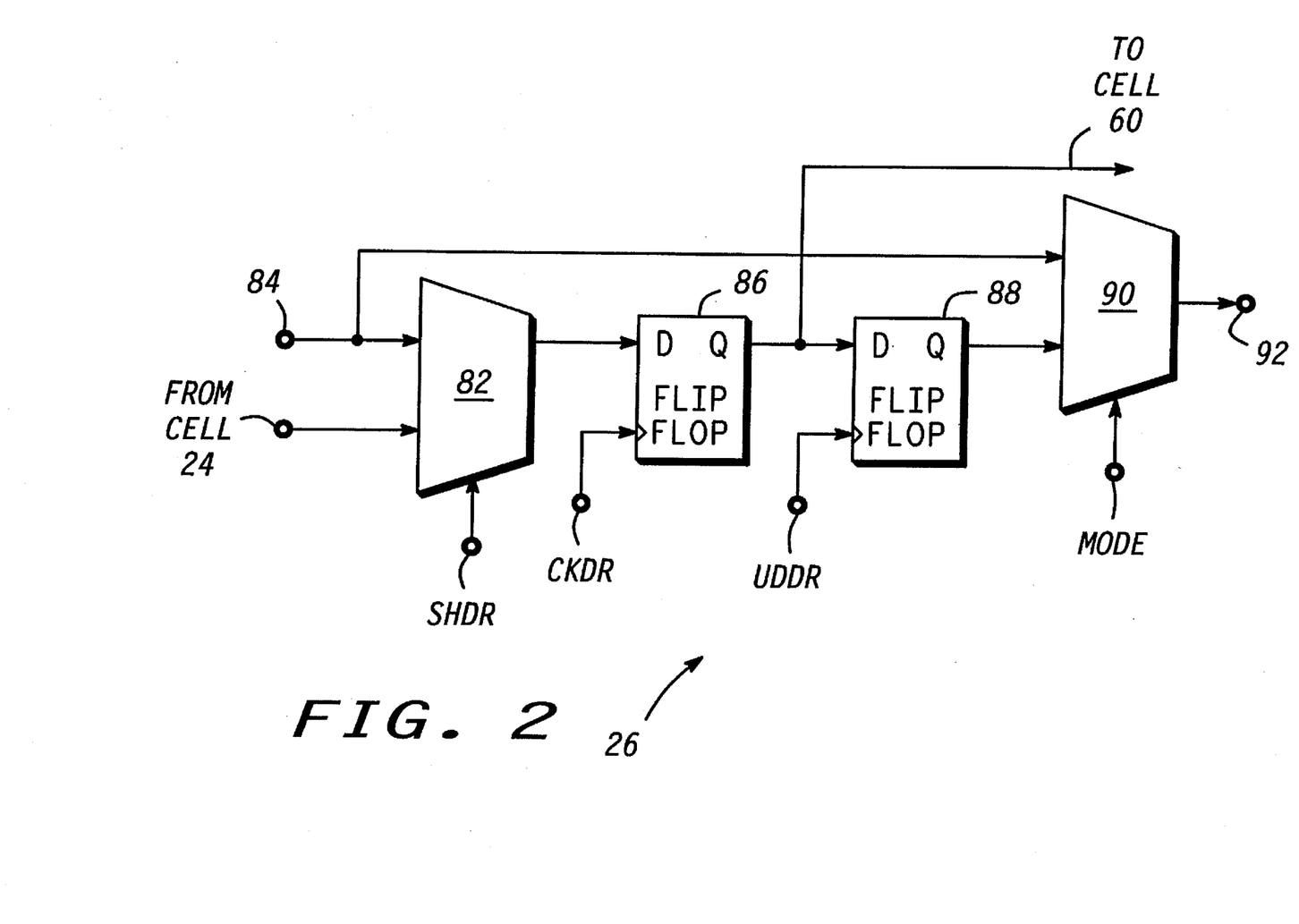
FIG. 2 illustrates a boundary scan cell of FIG. 1.

An example of the boundary scan cells, e.g. cell 26, is shown in FIG. 2. The boundary scan cells are controllable with control signals in accordance with IEEE standard 1149.1 as follows. Multiplexer 82 has one input coupled to the output of the previous cell, e.g. cell 24, and receives an input signal at terminal 84. The output of multiplexer 82 is coupled to the data input of flipflop 86. Multiplexer 82 is controlled by a standard IEEE SHDR (shift data register) signal. SHDR is asserted as logic one when the JTAG boundary scan cells are shifting data. The clock input of flipflop 86 receives a standard IEEE CKDR (clock data register) signal. CKDR is an in-phase derivative clock signal from TCK and operates when SHDR is logic one. The Q-output of flipflop 86 is coupled to the input of the next boundary scan cell, e.g. cell 60, and to the data input of flipflop 88. The clock input of flipflop 88 receives a standard IEEE UDDR (update data register) signal. UDDR is asserted as logic one when shifting is complete causing the current value on the Q-output of flipflop 86 to be clocked into flipflop 88 and passed through multiplexer 90 to terminal 92. The Q-output of flipflop 88 is coupled to one input of multiplexer 90. The second input of multiplexer 90 receives the TEST DATA IN signal. Multiplexer 90 is controlled by a standard IEEE MODE signal from the state machine. MODE selects between JTAG updated test data signals and normal system data signals. The output of multiplexer 90 is coupled to terminal 92.

Boundary scan cell 26 operates with pin 36 as an input pin or as an output pin of IC 12. If pin 36 is an input pin to IC 12, then terminal 84 is coupled to pin 36 and terminal 92 is coupled to other circuitry in IC 12 intended to receive the input signal from pin 36. If pin 36 is an output pin from IC 12, then terminal 92 is coupled to pin 36 and terminal 84 is coupled to other circuitry in IC 12 intended to send an output signal through pin 36. During normal operation, the MODE control signal selects the path from terminal 84 through multiplexer 90. The I/O signals for pin 30 pass through multiplexer 90 independent of the JTAG cell. Assume for this example that pin 36 is an output to pin 50 of IC 16.

When JTAG testing is underway, the MODE control signal enables the path from flipflop 88 through multiplexer 90. For shift mode, the SHDR control signal enables the path from the previous boundary scan cell, i.e. cell 24, through multiplexer 82 to the data input of flipflop 86. For cell 20, the previous boundary scan cell is actually TEST DATA IN.

Following a CKDR clock, the Q-output of flipflop 86 passes the TEST DATA signal to the next boundary scan cell, i.e. cell 60. For capture mode where the TEST DATA is sent from pin 36 to pin 50 along the interconnect path, the TEST DATA signal at the Q-output of flipflop 86 latches into flipflop 88 upon receiving an UDDR clock. Flipflop 88 holds the TEST DATA signal for capture by cell 40 in IC 14. The TEST DATA signal received at pin 50, i.e. terminal 84 in boundary scan cell 40, is routed through its multiplexer 82 and stored in flipflop 86 so that it may continue along through cells 42, 44 and 46.

One of the requirements of JTAG testing under the IEEE 1149.1 standard is to support bypass mode where an IC chip can be disabled from shifting the test pattern through each of its boundary scan cells. In IC 12, bypass cell 94 is coupled between the input of cell 20 and the output of cell 26. In IC 14, bypass cell 96 is coupled between the input of cell 60 and the output of cell 66. In IC 16, bypass cell 97 is coupled between the input of cell 40 and the output of cell 46. In IC 18, bypass cell 98 is coupled between the input of cell 70 and the output of cell 76. The bypass cells comprise a register and multiplexer (not shown) to store and route the TEST DATA signal. Bypass mode is typically used to speed up the testing process by side stepping an IC. If its particular connectivity is not under test, there is no reason to shift the TEST DATA signal through the IC. The IEEE standard calls for a single-register(one clock cycle) delay through the IC chip when operating in JTAG bypass mode.

For example, in the interconnect test between pin 36 and pin 50, bypass cell 96 may be activated with a IEEE standard BYPASS instruction to bypass IC 14 and bypass cell 98 may be activated to bypass IC 18. Bypass mode places a one clock cycle delay in the serial shift path for a given IC rather than shifting through its boundary scan cells. The efficiencies afforded by bypass mode become significant in actual IC applications with many boundary scan cells for the IC I/O pins.

The aforedescribed internal JTAG testing within MCM 10 is typically performed by the manufacturer. The end user often incorporates MCM 10 with other ICs, or other MCMs, on a printed circuit board. During external JTAG test, the end user treats MCM 10 as just another IC. Therefore, it is necessary to place MCM 10 as a whole in bypass mode while maintaining the IEEE standard one clock cycle delay.

As part of the present invention, bypass circuit 80 receives the TEST DATA IN signal at one input while the output of cell 76 is coupled to its second input. The output of bypass circuit 80 provides the TEST DATA OUT signal of MCM 10. During the internal MCM test, bypass circuit 80 becomes transparent. When the end user needs to bypass MCM 10 during external JTAG testing, bypass circuit 80 provides the single clock cycle delay to comply with IEEE standard 1149.1. As the BYPASS instruction is sent into MCM 10, bypass circuit 80 takes the TEST DATA IN signal and passes it directly as TEST DATA OUT with the one clock cycle delay. Thus, MCM 10 complies with IEEE standard during external printed circuit board test by the end user.

Figure 3:
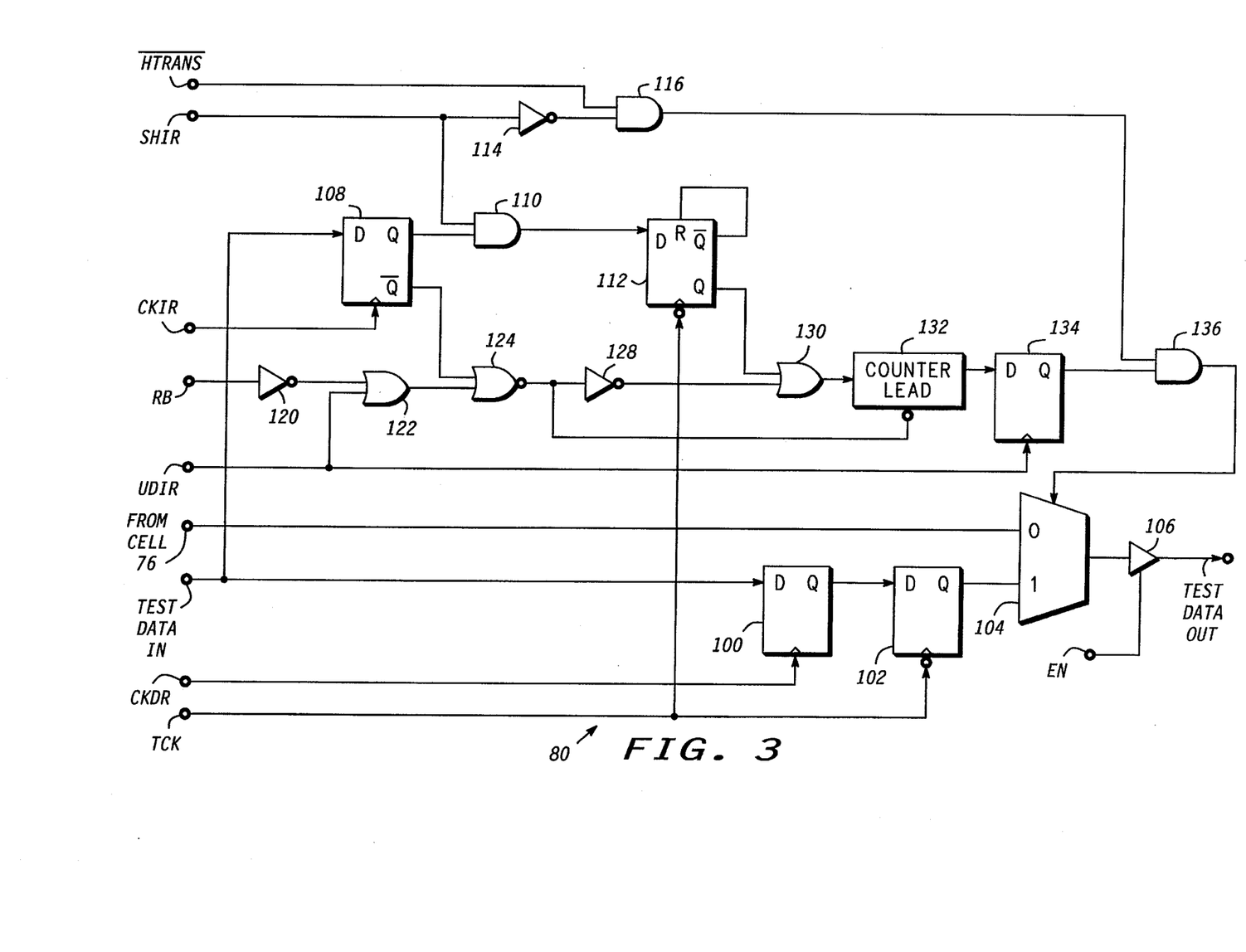
FIG. 3 illustrates a first embodiment of the bypass circuit of FIG. 1.

Turning to FIG. 3, further detail of bypass circuit 80 is shown including D-type flipflop 100 having a data input receiving the TEST DATA IN signal and having a Q-output coupled to the data input of D-type flipflop 102. Flipflop 100 is clocked by the rising edge of CKDR. Flipflop 102 is clocked by the falling edge of the TCK clock signal. The Q-output of flipflop 102 is coupled to a first input of multiplexer 104. A second input of multiplexer 104 receives the TEST DATA signal from boundary scan cell 76 in FIG. 1. The output of multiplexer 104 is coupled through tri-state buffer 106 enabled by a standard IEEE control signal EN (enable) for providing the TEST DATA OUT signal of MCM 10.

Bypass circuit 80 further includes D-type flipflop 108 receiving the TEST DATA IN signal at its data input. A standard IEEE control signal CKIR (clock instruction register) clocks the clock input of flipflop 108 on its rising edge. CKIR is an in-phase derivative clock signal from TCK and operates when instructions are shifting and during capture mode. The Q-output of flipflop 108 is coupled to a first input of AND gate 110. The output of AND gate 110 is coupled to the data input of D-type flipflop 112. Flipflop 112 clocks on the falling edge of the TCK clock signal. The $\overline{Q}$-output of flipflop 112 is coupled to its reset input. A standard IEEE control signal SHIR (shift instruction register) is applied to a second input of AND gate 110 and further through inverter 114 to a first input of AND gate 116. SHIR asserts a logic one when the JTAG instruction register receives a shift instruction, i.e. prepare to shift the TEST DATA signal around the boundary scan cells.

A control signal $\overline{HTRANS}$ (hard transparent mode) is applied at a second input of AND gate 116. The $\overline{HTRANS}$ signal is not a standard IEEE control signal but rather is asserted by the MCM manufacturer as an override to force deactivation of bypass circuit 80. A standard IEEE control signal RB (reset) is applied through inverter 120 to a first input of OR gate 122. Control signal RB is asserted as a logic zero whenever MCM 10 is reset. The second input of OR gate 122 receives a standard IEEE control signal UDIR (update instruction register). UDIR is asserted as logic one at the end of an instruction register serial shift sequence to update the instruction register with the new instruction that has been shifted in.

NOR gate 124 has a first input coupled to the $\overline{Q}$-output of flipflop 108 and a second input coupled to the output of OR gate 122. The output of NOR gate 124 is coupled through inverter 128 to a first input of OR gate 130. The second input of OR gate 130 is coupled to the Q-output of flipflop 112. Counter 132 has a clock input coupled to the output of OR gate 130 and a load input activated by a low signal from the output of NOR gate 124. The output of counter 132 is coupled to the data input of D-type flipflop 134 which further includes a clock input coupled for receiving the UDIR clock signal. AND gate 136 has a first input coupled to the output of AND gate 116 and a second input coupled to the Q-output of flipflop 134. The output of AND gate 136 provides the control signal to the control input of multiplexer 104.

When the MCM manufacturer performs internal JTAG testing on ICs 12–18, the $\overline{HTRANS}$ signal is asserted as logic zero to asynchronously disable bypass circuit 80. That is, a logic zero $\overline{HTRANS}$ signal causes the output of AND gate 116 to go to logic zero and, accordingly, the output of AND gate 136 goes to logic zero. The logic zero output signal from AND gate 136 controls multiplexer 104 to pass the TEST DATA signal from cell 76 to TEST DATA OUT when the EN control signal enables tri-state buffer 106. Override signal $\overline{HTRANS}$ effectively disables other circuitry in bypass circuit 80 since multiplexer 104 is forced to pass the TEST DATA signal from cell 76 regardless of the status of counter 132. Thus, the TEST DATA signal passes through ICs 12–18 during internal JTAG testing.

Another situation where multiplexer 104 passes the TEST DATA signal from cell 76 to TEST DATA OUT occurs when the SHIR is logic one indicating a instruction shift in process. With SHIR at logic one, the output of inverter 114 is logic zero and the outputs of AND gates 116 and 136 are logic zero. Multiplexer 104 passes the TEST DATA signal from cell 76 to TEST DATA OUT when the EN control signal enables tri-state buffer 106. When instructions are serially shifting through the IC instruction registers, it is important that the instructions continue to the next IC. Hence, the normal configuration during instruction shifting is to pass through each instruction register and avoid bypass mode.

To place MCM 10 in JTAG compatible bypass mode for external testing at the board level by the end user, i.e. MCM 10 treated as a single IC, the bypass instruction consisting of all logic ones must be clocked into ICs 12–18. The same logic ones are also clocked into bypass circuit 80. Assume each instruction register of ICs 12–18 is three bits wide. The width of counter 132 is set to the number of bits per instruction register times the number of ICs in MCM 10, i.e. twelve bits wide in the present embodiment. Counter 132 may be set to count up or count down. If counter 132 counts up, then it loads with logic zeroes upon receiving a logic zero from NOR gate 124. If counter 132 counts down, then it loads with a count equal to the total number of instruction register cells upon receiving a logic zero from NOR gate 124.

The logic one TEST DATA IN clocks into flipflop 108 upon receiving a rising CKIR clock signal. Assuming SHIR is logic one, the data input of flipflop 112 receives a logic one at the falling edge of the TCK clock signal. The Q-output of flipflop 112 goes to logic one while the $\overline{Q}$-output resets flipflop 112. The Q-output generates a pulse having a width dependent on the reset propagation delay through flipflop 112. A delay circuit (not shown) may be inserted in the reset path to widen the pulse from the Q-output of flipflop 112. The output of OR gate 130 goes to logic one and clocks counter 132. If counter 132 receives twelve consecutive clocks without being reset, then bypass mode is detected and the output of counter 132 asserts a logic one to the data input of flipflop 134. Any logic zero during the TEST DATA IN sequence causes the $\overline{Q}$-output of flipflop 108 to go to logic one thereby producing a logic zero at the output of NOR gate 124 and resetting counter 132. Likewise, a logic zero RB reset control signal or a logic one UDIR control signal resets counter 132. It is important that UDIR latches the output state of counter 132 into flipflop 134 before the counter is reset. Therefore, additional delay may be inserted in the reset path of RB as needed.

The rising edge of UDIR indicating the end of the instruction shifting sequence clocks flipflop 134 to latch the output signal from counter 132. The SHIR control signal is logic zero whenever UDIR changes logic level. If counter 132 receives twelve consecutive logic one clocks to completely count up (or count down), then the rising edge of UDIR clocks a logic one into flipflop 134. The logic ones at the inputs of AND gate 136 select the path through multiplexer 104 from flipflops 100 and 102. The path through flipflops 100 and 102 provides a one clock delay because flipflop 100 is clocked off the rising edge of CKDR while flipflop 102 is clocked off the falling edge of TCK. The IEEE standard one clock delay for bypass mode is thus satisfied when the end users treats MCM 10 as a single IC on the printed circuit board.

Figure 4:
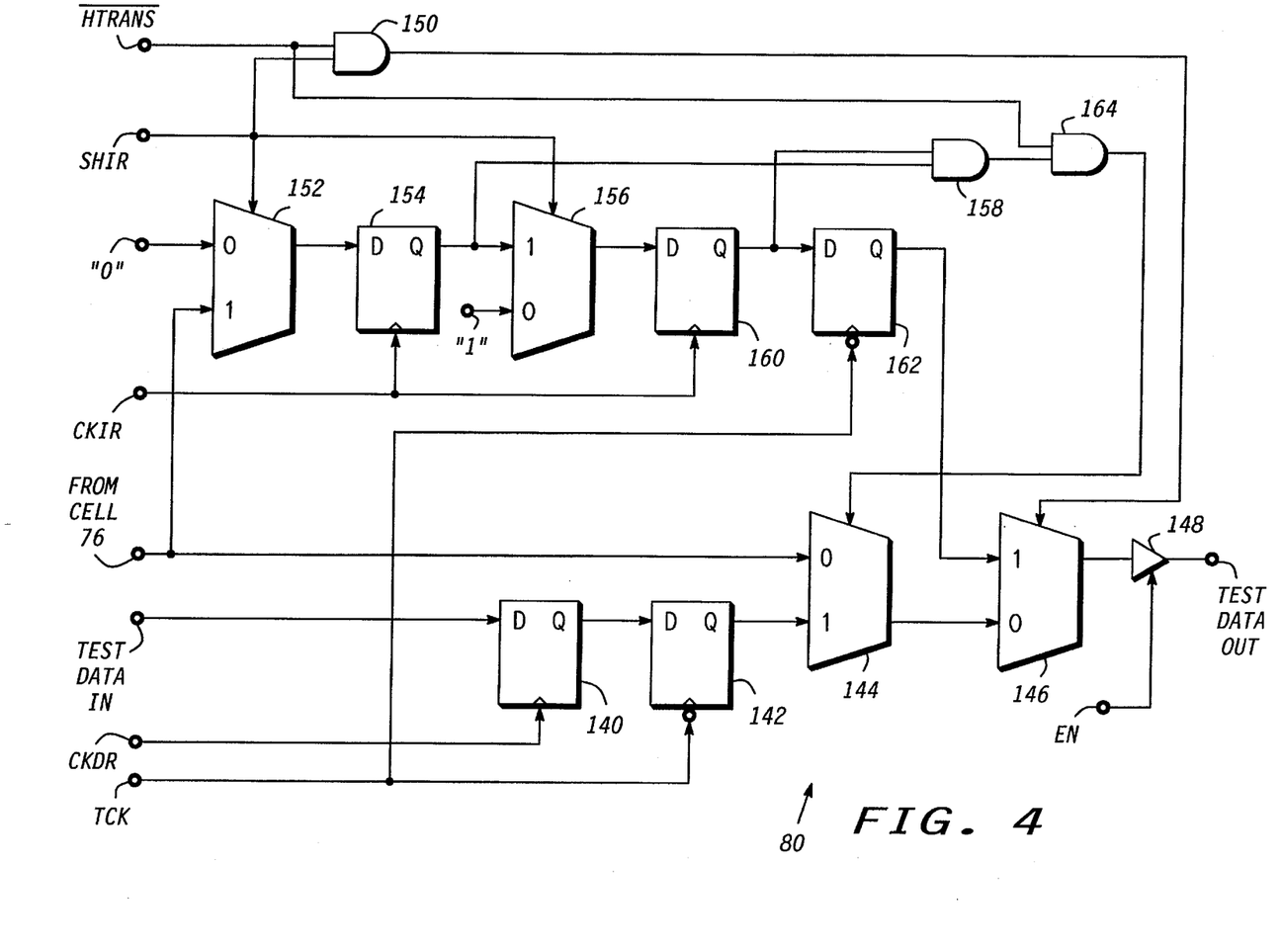
FIG. 4 illustrates a second embodiment of the bypass circuit of FIG. 1.

In FIG. 4, an alternate embodiment of bypass circuit 80 is shown including D-type flipflop 140 having a data input receiving the TEST DATA IN signal and having a Q-output coupled to the data input of D-type flipflop 142. Flipflop 140 is clocked by the rising edge of CKDR. Flipflop 142 is clocked by the falling edge of the TCK clock signal. The Q-output of flipflop 142 is coupled to a first input of multiplexer 144. The second input of multiplexer 144 receives the TEST DATA signal from boundary scan cell 76 in FIG. 1. The output of multiplexer 144 is coupled to a first input of multiplexer 146. The output of multiplexer 146 is coupled to an input of tri-state buffer 148 enabled by the standard IEEE control signal EN for providing the TEST DATA OUT signal of MCM 10.

Bypass circuit 80 further includes AND gate 150 receiving the $\overline{\text{HTRANS}}$ control signal and SHIR control signals. The output of AND gate 150 provides the control input to multiplexer 146. The SHIR control signal controls multiplexer 152 to select between a logic zero hard-wired to its first input and the TEST DATA signal from boundary scan cell 76 at its second input. The output of multiplexer 152 is coupled to the data input of flipflop 154. The clock input of flipflop 154 receives the CKIR clock signal. The Q-output of flipflop 154 is coupled to a first input of multiplexer 156 and to a first input of AND gate 158. A second input of multiplexer 156 receives a hard-wired logic one. The SHIR control signal also controls multiplexer 156 to select between the logic one hard-wired to its first input and the Q-output of flipflop 154 at its second input. Flipflop 160 receives the output signal from multiplexer 156 at its data input and the CKIR clock signal at its clock input. The Q-output of flipflop 160 is coupled to a data input of flipflop 162 and to a second input of AND gate 158. Flipflop 162 receives the TCK clock signal at its clock input. AND gate 164 receives the output signal from AND gate 158 and the $\overline{\text{HTRANS}}$ control signal at its inputs. The output of AND gate 164 controls multiplexer 144.

The implementation of bypass circuit 80 shown in FIG. 4 adds two bits to the concatenated instruction register chain as provided by the IEEE standard 1149.1. Bypass circuit 80 monitors the last two bits sent during the instruction sequence and enters bypass mode upon detecting two logic ones in the last two bit locations.

When the MCM manufacturer performs internal JTAG testing on ICs 12–18, the $\overline{\text{HTRANS}}$ signal is asserted as logic zero to asynchronously disable bypass circuit 80. That is, a logic zero $\overline{\text{HTRANS}}$ signal causes the output of AND gate 150 to go to logic zero and, accordingly, the output of AND gate 164 goes to logic zero. The logic zero output signal from AND gate 164 controls multiplexer 144 to pass the TEST DATA signal from cell 76 to multiplexer 146. The logic zero output signal from AND gate 150 controls multiplexer 146 to pass the TEST DATA signal from multiplexer 144 to TEST DATA OUT when the EN control signal enables tri-state buffer 148. Override control signal $\overline{\text{HTRANS}}$ effectively disables other circuitry in bypass circuit 80 since multiplexers 144 and 146 are forced to pass the TEST DATA signal from cell 76 regardless of the status of other detection circuitry.

Another situation where multiplexer 146 passes the TEST DATA signal from cell 76 to TEST DATA OUT occurs when the SHIR is logic one indicating an instruction shift in process. The $\overline{\text{HTRANS}}$ signal is logic one producing a logic one at the control input of multiplexer 146. With SHIR at logic one, the path from cell 76 is enabled through multiplexer 152 and the TEST DATA is latched into flipflop 154 at the rising edge of the next CKIR clock signal. The logic one SHIR also selects the path through multiplexer 156 from the output of flipflop 154 to be latched into flipflops 160 and 162 during the next full clock cycle. Multiplexer 146 passes the Q-output of flipflop 162 through tri-state buffer 148 as TEST DATA OUT. When instruction are serially shifting through the IC instruction registers, it is important that the instruction continue to the next IC. Hence, the normal configuration during instruction shifting is to pass through each instruction register and avoid bypass mode.

A logic zero SHIR during a rising edge of CKIR initiates capture mode. When SHIR is logic zero, multiplexer 152 passes the hard-wired logic zero to flipflop 154 where it is latched during the following rising edge of the CKIR clock signal. Multiplexer 156 passes the hard-wired logic one to flipflops 160 and 162. Following capture mode, SHIR goes to logic one thereby initiating a shift of the instruction register to shift out through multiplexer 146 the logic zero and logic one from flipflop 154 and flipflop 160–162, respectively. Capture mode requires that a fixed bit pattern be loaded into the two least significant instruction register locations. The fixed bit pattern must have a logic one on the first bit which can subsequently be scanned from the chain and a logic zero on the last bit which can subsequently be scanned from the chain.

To place MCM 10 in JTAG compatible bypass mode for external testing at the board level by the end user, i.e. MCM 10 treated as a single IC, the bypass instruction must end with two logic ones. Note that the instruction sequence is two bits longer than the sum of instructions registers in ICs 12–18. Assume the instruction sequence ended with two logic ones as prescribed to enter bypass mode. SHIR is originally logic one enabling the path from cell 76 through multiplexer 152. The Q-output of flipflop 154 is logic one and the Q-output of flipflop 160 is logic one causing the output of AND gate 164 to go to logic one to enable the path from the Q-output of flipflop 142 through multiplexer 144. Once SHIR goes to logic zero at the end of the instruction sequence, the output of AND gate 150 goes to logic zero and selects the path from the output of multiplexer 144 through multiplexer 146. The TEST DATA IN signal passes through flipflops 140 and 142 during one full clock period. The path through flipflops 140 and 142 provides a one clock delay because flipflop 140 is clocked off the rising edge of CKDR while flipflop 142 is clocked off the falling edge of TCK. Multiplexers 144 and 146 are enabled to pass the TEST DATA IN signal from the Q-output of flipflop 142 through tri-state buffer 148 as TEST DATA OUT. The IEEE standard one clock delay for bypass mode is thus satisfied when the end users treats MCM 10 as a single IC on the printed circuit board.

Figure 5:
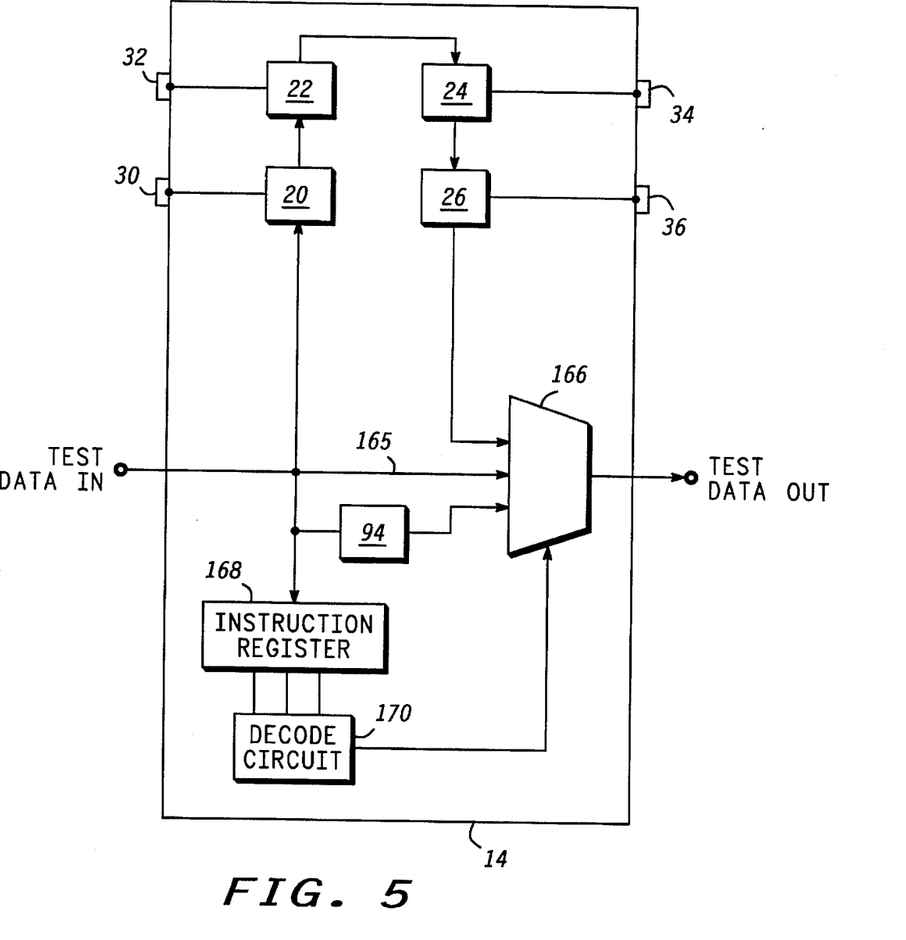
FIG. 5 illustrates a third embodiment of the bypass circuit of FIG. 1.

In yet another embodiment of the present invention as shown in FIG. 5, an MCM bypass connection 165 is added to each IC between TEST DATA IN and one input of a data multiplexer 166. The second and third inputs of multiplexer 166 receive the output of bypass register 94 and the output of the last boundary scan cell, e.g. cell 26 in IC 12, respectively. The predetermined instruction sequence from TEST DATA IN is stored in instruction register 168 and decoded by decode circuit 170 to control multiplexer 166.

To place MCM 10 in bypass mode using the embodiment of FIG. 5, three ICs (e.g., ICs 12, 14 and 16) are placed in MCM bypass mode to select the path from connection 165 through multiplexer 166. The fourth IC (e.g. IC 18) is placed in standard bypass mode through bypass cell 98. Any single one of the bypass cells could be selected for providing the one clock delay with the remaining ICs routed straight through connection 165 to multiplexer 166. The resulting configuration provides a single clock cycle delay as dictated by the IEEE 1149.1 standard.

By now it should be appreciated that the present invention allows MCMs to be fully JTAG compatible including support for printed circuit board test by the end user. A bypass circuit detects a bypass instruction sequence and inserts a one cycle delay for the MCM as a whole. The MCM manufacturer may still perform JTAG testing by routing test signals through the ICs of the MCM.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A multichip module compatible with JTAG testing, comprising:

a plurality of IC die disposed on a substrate and interconnected by serially coupled registers within said plurality of IC die where a first register receives a test data input signal to the multichip module and a last register provides a first test data output signal;

a delay register having an input coupled for receiving said test data input signal; and a first multiplexer having first and second data inputs, a control input and an output, said first data input being coupled to said output of said delay register, said second data input being coupled for receiving said first test data output signal, said control input receiving a control signal that selects between said test data input signal and said first test data output signal as a second test data output signal at said output of the multichip module.

2. The multichip module of claim 1 further including a control circuit responsive to a predetermined sequence of said test data input signal for providing said control signal.

3. The multichip module of claim 2 wherein said delay register includes:

a first flipflop having a data input, a clock input and an output, said data input being coupled for receiving said test data input signal, said clock input being coupled for receiving a first clock signal; and a second flipflop having a data input, a clock input and an output, said data input being coupled to said output of said first flipflop, said clock input being coupled for receiving a second clock signal, said output being coupled to said first data input of said first multiplexer.

4. The multichip module of claim 3 wherein said control circuit includes:

a third flipflop having a data input, a clock input and first and second complementary outputs, said data input being coupled for receiving said test data input signal, said clock input being coupled for receiving a third clock signal;

a first AND gate having first and second inputs and an output, said first input being coupled to said first complementary output of said third flipflop, said second input being coupled for receiving a shift control signal;

a fourth flipflop having a data input, a clock input, a reset input, and first and second complementary outputs, said data input being coupled to said output of said first AND gate, said clock input being coupled for receiving said second clock signal, said second complementary output being coupled to said reset input;

a first OR gate having first and second inputs and an output, said first input being coupled to said first complementary output of said fourth flipflop, said output providing said predetermined sequence of said test data input signals;

a second OR gate having first and second inputs and an output, said first input being coupled for receiving an update control signal, said second input being coupled for receiving a reset control signal;

a first NOR gate having first and second inputs and an output, said first input being coupled to said second complementary output of said third flipflop, said second input being coupled to said output of said second OR gate; and a first inverter having an input coupled to said output of said first NOR gate and having an output coupled to said second input of said first OR gate.

5. The multichip module of claim 4 wherein said control circuit further includes:

a counter having a clock input, a reset input, and an output, said clock input being coupled to said output of said first OR gate, said reset input being coupled to said output of said first NOR gate; and a fifth flipflop having a data input, a clock input and an output, said data input being coupled to said output of said counter, said clock input being coupled for receiving said update control signal, said output providing said control signal.

6. The multichip module of claim 5 wherein said control circuit further includes:

a second AND gate having first and second inputs and an output, said first input being coupled for receiving a transparent mode control signal;

a second inverter having an input coupled for receiving said shift control signal and having an output coupled to said second input of said second AND gate; and a third AND gate having first and second inputs and an output, said first input being coupled to said output of said second AND gate, said second input being coupled to said output of said fifth flipflop, said output providing said control signal to said control input of said first multiplexer.

7. The multichip module of claim 3 wherein said control circuit further includes:

a second multiplexer having first and second data inputs, and an output, said first data input being coupled to said output of said first multiplexer; and a tri-state buffer having a data input, a control input and an output, said input being coupled to said output of said second multiplexer, said control input receiving an enable control signal, said output providing said second test data output signal.

8. The multichip module of claim 7 wherein said control circuit further includes:

a third multiplexer having first and second data inputs, a control input and an output, said first data input being coupled for receiving a data signal having a first logic state, said second data input being coupled for receiving said first test data output signal, said control input receiving a shift control signal;

a third flipflop having a data input, a clock input, and an output, said data input being coupled to said output of said third multiplexer, said clock input being coupled for receiving a third clock signal;

a fourth multiplexer having first and second data inputs, a control input and an output, said first data input being coupled to said output of said third flipflop, said second data input being coupled for receiving for receiving a data signal having a second logic state, said control input receiving said shift control signal;

a fourth flipflop having a data input, a clock input, a reset input, and an output, said data input being coupled to said output of said fourth multiplexer, said clock input being coupled for receiving said third clock signal; and a fifth flipflop having a data input, a clock input, a reset input, and an output, said data input being coupled to said output of said fourth flipflop, said clock input being coupled for receiving said second clock signal, said output being coupled to a second data input of said second multiplexer.

9. The multichip module of claim 8 wherein said control circuit further includes:

a first AND gate having first and second inputs and an output, said first input being coupled for receiving a transparent mode control signal, said second input being coupled for receiving said shift control signal, said output being coupled to a control input of said second multiplexer;

a second AND gate having first and second inputs and an output, said first input being coupled to said output of said third flipflop, said second input being coupled to said output of said fourth flipflop; and a third AND gate having first and second inputs and an output, said first input being coupled for receiving said transparent mode control signal, said second input being coupled to said output of said second AND gate, said output being coupled to said control input of said first multiplexer.

10. A multichip module compatible with JTAG testing, comprising:

an IC die disposed on a substrate with a plurality of serially coupled registers where a first register receives a test data input signal to the multichip module and a last register provides a first test data output signal;

a delay register having an input coupled for receiving said test data input signal; and a first multiplexer having first and second data inputs, a control input and an output, said first data input being coupled to said output of said delay register, said second data input being coupled for receiving said first test data output signal, said control input receiving a control signal that selects between said test data input signal and said first test data output signal as a second test data output signal of the multichip module.

11. The multichip module of claim 10 further including a control circuit responsive to a predetermined sequence of said test data input signals for providing said control signal.

12. The multichip module of claim 11 wherein said delay register includes:

a first flipflop having a data input, a clock input and an output, said data input being coupled for receiving said test data input signal, said clock input being coupled for receiving a first clock signal; and a second flipflop having a data input, a clock input and an output, said data input being coupled to said output of said first flipflop, said clock input being coupled for receiving a second clock signal, said output being coupled to said first data input of said first multiplexer.

13. The multichip module of claim 12 wherein said control circuit further includes:

a second multiplexer having first and second data inputs, and an output, said first data input being coupled to said output of said first multiplexer; and a tri-state buffer having a data input, a control input and an output, said input being coupled to said output of said second multiplexer, said control input receiving an enable control signal, said output providing said second test data output signal.

14. The multichip module of claim 13 wherein said control circuit further includes:

a third multiplexer having first and second data inputs, a control input and an output, said first data input being coupled for receiving a data signal having a first logic state, said second data input being coupled for receiving said first test data output signal, said control input receiving a shift control signal;

a third flipflop having a data input, a clock input, and an output, said data input being coupled to said output of said third multiplexer, said clock input being coupled for receiving a third clock signal;

a fourth multiplexer having first and second data inputs, a control input and an output, said first data input being coupled to said output of said third flipflop, said second data input being coupled for receiving for receiving a data signal having a second logic state, said control input receiving said shift control signal;

a fourth flipflop having a data input, a clock input, a reset input, and an output, said data input being coupled to said output of said fourth multiplexer, said clock input being coupled for receiving said third clock signal; and a fifth flipflop having a data input, a clock input, a reset input, and an output, said data input being coupled to said output of said fourth flipflop, said clock input being coupled for receiving said second clock signal, said output being coupled to a second data input of said second multiplexer.

15. The multichip module of claim 14 wherein said control circuit further includes:

a first AND gate having first and second inputs and an output, said first input being coupled for receiving a transparent mode control signal, said second input being coupled for receiving said shift control signal, said output being coupled to a control input of said second multiplexer;

a second AND gate having first and second inputs and an output, said first input being coupled to said output of said third flipflop, said second input being coupled to said output of said fourth flipflop; and a third AND gate having first and second inputs and an output, said first input being coupled for receiving said transparent mode control signal, said second input being coupled to said output of said second AND gate, said output being coupled to said control input of said first multiplexer.

16. The multichip module of claim 12 wherein said control circuit includes:

a third flipflop having a data input, a clock input and first and second complementary outputs, said data input being coupled for receiving said test data input signal, said clock input being coupled for receiving a third clock signal;

a first AND gate having first and second inputs and an output, said first input being coupled to said first complementary output of said third flipflop, said second input being coupled for receiving a shift control signal;

a fourth flipflop having a data input, a clock input, a reset input, and first and second complementary outputs, said data input being coupled to said output of said first AND gate, said clock input being coupled for receiving said second clock signal, said second complementary clock signal being coupled to said reset input;

a first OR gate having first and second inputs and an output, said first input being coupled to said first complementary output of said fourth flipflop, said output providing said predetermined sequence of said test data input signals;

a second OR gate having first and second inputs and an output, said first input being coupled for receiving an update control signal, said second input being coupled for receiving a reset control signal;

a first NOR gate having first and second inputs and an output, said first input being coupled to said second complementary output of said third flipflop, said second input being coupled to said output of said second OR gate; and a first inverter having an input coupled to said output of said first NOR gate and having an output coupled to said second input of said first OR gate.

17. The multichip module of claim 16 wherein said control circuit further includes:

a counter having a clock input, a reset input, and an output, said clock input being coupled to said output of said first OR gate, said reset input being coupled to said output of said first NOR gate; and a fifth flipflop having a data input, a clock input and an output, said data input being coupled to said output of said counter, said clock input being coupled for receiving said update control signal, said output providing said control signal.

18. The multichip module of claim 17 wherein said control circuit further includes:

a second AND gate having first and second inputs and an output, said first input being coupled for receiving a transparent mode control signal;

a second inverter having an input coupled for receiving said shift control signal and having an output coupled to said second input of said second AND gate; and a third AND gate having first and second inputs and an output, said first input being coupled to said output of said second AND gate, said second input being coupled to said output of said fifth flipflop, said output providing said control signal to said control input of said first multiplexer.

19. A method of JTAG testing a multichip module, comprising the steps of:

monitoring a test data input signal for a predetermined sequence of logic states;

enabling a path for said test data input signal through serially coupled by registers within a plurality of IC die disposed on a substrate of the multichip module upon detecting other than said predetermined sequence of logic states of said test data input signal; and bypassing said test data input signal around said serially coupled by registers within said plurality of IC die disposed on said substrate of the multichip module upon detecting said predetermined sequence of logic states of said test data input signal while delaying said test data input signal by one clock cycle.

* * * * *

UNITED STATES PATENT AND TRADEMARK OFFICE
CERTIFICATE OF CORRECTION

PATENT NO.   : 5,568,492
DATED        : October 22, 1996
INVENTOR(S)  : Andrew Flint, James R. Trent, Jerome A. Grula It is certified that error appears in the above-indentified patent and that said Letters Patent is hereby corrected as shown below:

In Claim 8, column 11, line 1, delete the second occurrence of "for receiving".

In Claim 14, column 12, line 21, delete the second occurrence of "for receiving".

Signed and Sealed this

Fifteenth Day of July, 1997

Attest:

Attesting Officer

BRUCE LEHMAN

Commissioner of Patents and Trademarks